(12) United States Patent
Schmidt

(10) Patent No.: US 6,295,200 B1
(45) Date of Patent: Sep. 25, 2001

(54) CARRIER ASSEMBLY AND METHOD

(75) Inventor: Detlef Schmidt, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/511,227

(22) Filed: Feb. 23, 2000

(51) Int. Cl.[7] .................................................. H05H 7/20
(52) U.S. Cl. .................. 361/704; 165/802; 165/185; 174/16.3; 174/252; 361/707; 361/719; 257/718
(58) Field of Search .................. 165/80.2, 80.3, 165/185; 174/16.3, 252; 257/709–707, 711–713, 718, 720, 728, 731–733; 361/702, 704–708, 710, 711, 715, 719–721

(56) References Cited

U.S. PATENT DOCUMENTS

| | | | |
|---|---|---|---|
| 4,190,879 | * | 2/1980 | Tissot ..................................... 361/704 |
| 4,764,847 | * | 8/1988 | Eisenblatter et al. ................. 361/704 |
| 5,398,160 | * | 3/1995 | Umeda .................................. 361/707 |
| 5,825,625 | * | 10/1998 | Esterbreg et al. .................... 361/719 |
| 6,114,048 | * | 9/2000 | Jech et al. ............................. 361/707 |
| 6,188,579 | * | 2/2001 | Buondelmonte et al. ........... 361/719 |

\* cited by examiner

*Primary Examiner*—Gregory Thompson
(74) *Attorney, Agent, or Firm*—Stephen S. Favakeh; Jeffrey K. Jacobs

(57) ABSTRACT

A carrier assembly (10) for a circuit board includes a copper insert (12) pressed into an aluminum carrier (14). The copper insert has an undercut recess (36). As the insert (12) is pressed into the carrier (14), a portion of the carrier material is flowed into the undercut recess (36) to provide a firm interlocking of the insert (12) with the carrier (14).

24 Claims, 3 Drawing Sheets

CARRIER ASSEMBLY AND METHOD

BACKGROUND OF THE INVENTION

1. Field of the Invention

The invention relates to carrier plates and, more particularly, to carrier plates for electronic components having improved thermal characteristics.

2. Description of the Related Art

A number of commercially important products employ a metal plate of some sort and require various features to be added to the metal plate. For example, assembly substrates sometimes need to be provided with upstanding locking lugs, standoffs, or threaded studs. While these features can be provided in the form of separately fabricated components, a problem arises as to the need for securely fastening these features to the substrate. In addition to mechanical type fasteners, metallurgical bonds such as soldering and brazing need to be formed on a metal substrate for purposes of joining various components to the substrate. One commercially important example of this type of joinder is found in the manufacture of high power radio frequency circuits, where circuit boards of relatively expensive materials are soldered to carrier plates providing a ground path and heat sink for the circuit boards.

Many commercially important high power radio frequency circuits are presently constructed using expensive ceramic circuit boards that are soldered to carriers made of costly graphite or AlSiC materials. The carrier not only provides physical support for the circuit board but also a much needed heat spreading and heat sink and a ground path for electronic devices carried on the circuit boards. It is important that the circuit boards and their carriers provide an efficient thermal conduction circuit in order to extend the life and improve the operating characteristics of the heat-generating electronic devices. Since substantial heat loading is expected to be encountered in many of these types of circuits, it is important that the circuit board and carrier be well matched with regard to their respective co-efficient of thermal expansion.

Accordingly, there is a need for an improved carrier plate in terms of both its performance and costs therefor. In particular, there is a need for a carrier plate for electronic power components, e.g. power transistors, that can employ lower cost materials and be efficiently manufactured.

DETAILED DESCRIPTION OF THE PREFERRED EMBODIMENTS

Figure 1:
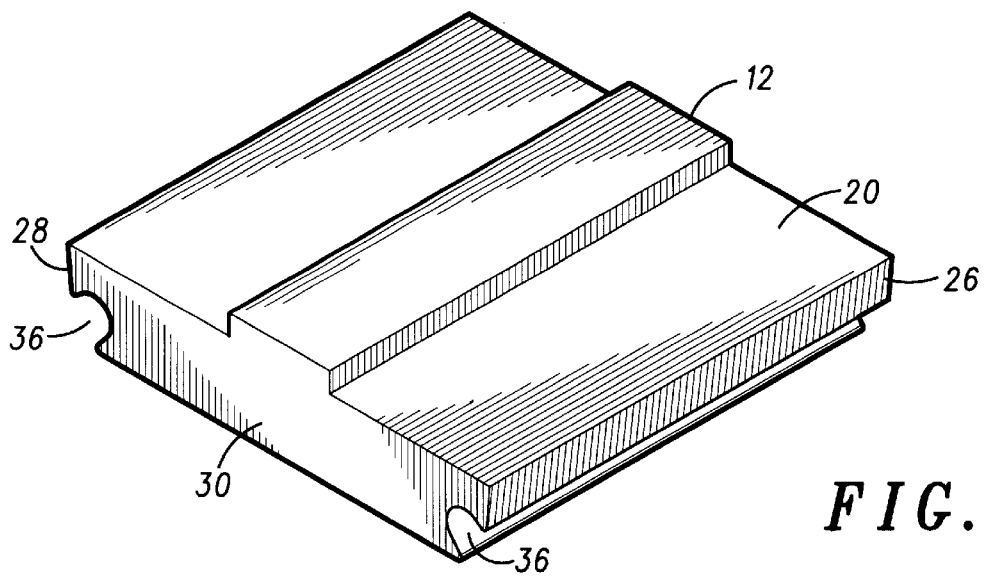
FIG. 1 is a perspective view of a carrier plate insert in accordance with the present invention.
Figure 2:
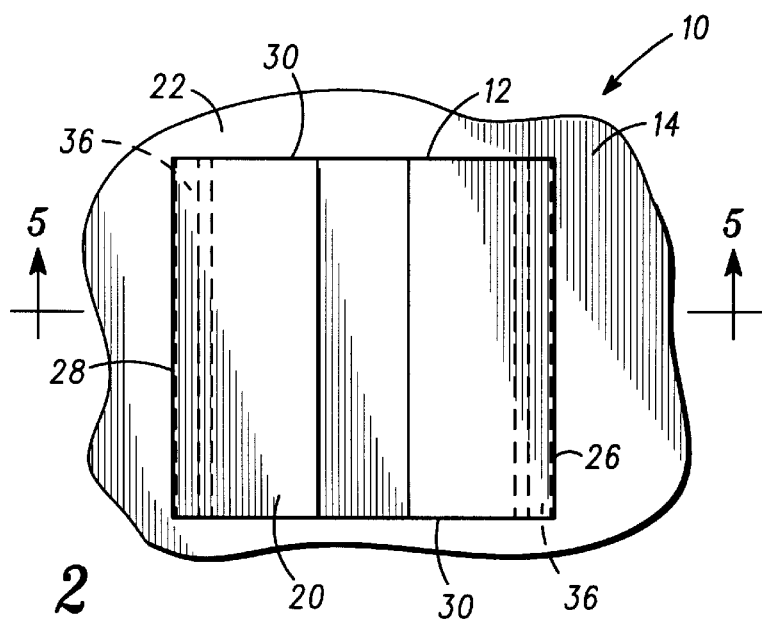
FIG. 2 is a plan view showing the insert seated within a carrier plate.

Despite the commercial success of current high power radio frequency circuit constructions, there is an ongoing effort to reduce cost, and, where possible, performance of the components. For instance, while circuit boards can be of fiberglass to provide cost benefits, fiberglass circuit boards do not have the required performance levels in RF applications in terms of their dielectric constant. It is important also that assembly practices be optimized wherever possible so as to reduce labor costs. A recent development of low cost laminate-type circuit boards with good dielectric constants for RF applications has further encouraged a re-evaluation of current practices. However, one problem with their use in RF applications is that these lower cost circuit boards described more particularly below do not dissipate heat very well. It has been found that more conventional materials for carrier plates can be employed since these materials more closely match the co-efficient of thermal expansion of the newer laminate-type circuit boards, such as those comprising a woven fiberglass, re-enforced ceramic filled PTFE based composite laminate material, commercially available under the trade designation AR 1000 or ARLON. These circuit boards have coefficients of thermal expansion that is closely matched to more conventional and substantially less expensive carrier materials, such as copper or aluminum, as described more fully hereinafter. Further, in RF applications, the majority of the heat is generated by the power transistor which the lower cost carrier plate material can dissipate.

Accordingly, the present invention is directed to a carrier assembly 10 which provides substantial manufacturing advantages and which optimizes the performance of materials used to make carriers for high power radio frequency circuit boards. Generally, it has been found that either aluminum or copper can be employed in carriers used with laminate circuit boards of the above-described type. Aluminum is attractive because of its lighter weight and, while the carrier could be formed exclusively of aluminum, it is recognized that certain technical applications such as the above-described RF application require enhanced thermal conductivity capability, beyond that of aluminum and aluminum alloy materials. On the other hand, while the entire carrier could be made from copper material which affords improved thermal conductivity, benefits of the copper are degraded with its relatively higher cost and heavier weight.

The present carrier assembly 10 is effective to combine the best aspects of both the aluminum and copper materials as described above. To this end, an insert 12 is provided that is preferably formed of copper which is aligned with a die body 13 of an RF transistor 15. Because at certain high temperatures, the durability of the transistor 15 can be adversely affected, it is important to keep the transistor 15 below such critical temperatures for maximizing their performance. Since the copper insert 12 is aligned with transistor die 13 it will provide the high efficiency heat transfer that is desirable where it is needed most, i.e. at the transistor 15. At the same time, having the insert 12 embedded in a carrier plate 14 that is preferably of aluminum will provide the needed physical support for circuit board 17 which can be relatively thin, i.e., on the order 0.35 inches in thickness, in a lighter weight and lower cost assembly over a solid copper plate, as discussed. The circuit board 17 to which the carrier assembly 10 is mounted is also preferably of a low cost composite laminate material with a high Dk(10), such as the previously-described AR 1000. The preferred copper and aluminum materials for the insert 12 and carrier 14, respectively, are also advantageous as they have coefficients of thermal expansion closely matching of that of AR 1000. In this manner, the carrier assembly 10 herein provides for high performance operation even under extreme conditions, e.g. high heat applications.

Figure 7:
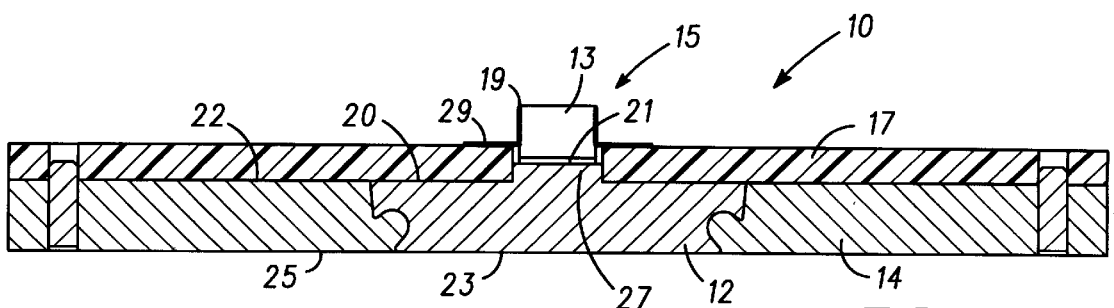
FIG. 7 is a cross-sectional view showing the insert fully seated within the carrier plate and carrying a circuit board having a power component thereon.

Referring more specifically to FIG. 7, the circuit board 17 of AR 1000 material is laminated to the carrier assembly 10 so that a through opening 19 in the board 17 is aligned with the copper insert 12 of the assembly 10. A heat conducting flange 21 depends from the bottom of the transistor die 13 into the opening 19 for being soldered to the insert 12 aligned therewith. In this manner, a heat path is provided from the transistor 15 to the carrier assembly insert 12 for dissipating heat from the RF circuit on board 17. Again, because the transistor 15 is responsible for most of the heat, e.g. 95%, generated by the RF circuit, the present carrier assembly 10 having two portions that are of distinct materials with respect to their heat dissipating capabilities is particularly well-suited for use therewith as material having the better heat dissipating properties, i.e. cooper, can be used for the insert 12 which forms a heat dissipation path with the transistor 15, and the remaining portion 14 of the carrier assembly 10 can be of the other material with worse heat dissipating properties, i.e. aluminum. A further advantage is found in that both the copper and aluminum materials of the carrier assembly 10 herein having coefficients of thermal expansion that closely match each other and that of AR 1000 of which the circuit board 17 is preferably formed.

In one aspect, the present invention affords cost eductions by using a composite dual metal carrier assembly 10 and which can be cold formed, thereby avoiding problems encountered when metals are heated to high temperatures. In the most preferred form, a smaller sized copper insert 12 is cold formed to interlock with a larger sized plate-like aluminum carrier 14. Cold forming is performed on the aluminum carrier 14 by the copper insert 12 and benefits are obtained in this regard by the difference in hardness between the copper insert 12 and aluminum carrier materials. As will be appreciated by those skilled in the art, the present invention may be also readily applied to materials other than copper and aluminum, especially inserts of a metal material having a hardness greater than that of the carrier or plate 14 with which the insert 12 is interlocked. For example, a brass insert can be interlockingly joined to a copper carrier using principles according to the present invention.

As will be seen herein, the metal insert 12 and carrier 14 are placed in a relatively high pressure stamping press. For manufacture of the preferred carrier assembly 10 described herein, a press of 400 ton rating can be used. Frequently in commercial scale stamping arrangements, parts are placed within a stamping machine where ready access thereto for last minute positioning is not readily possible due to safety and other concerns. The present invention, in certain aspects, provides advantages in positively orienting the insert part 12 with respect to the carrier 14, prior to insertion in the stamping press. In addition, it is important that control of the insert 12 be maintained throughout the cold forming operation and the present invention provides improvements in this regard, as well.

It is frequently desirable when fabricating radio frequency circuits, to provide electrical shielding around the active circuit components to provide protection against stray interference, unwanted radiations, and the like. In one aspect, the present invention provides important advantages in forming upstanding shielding walls simultaneous with the interlocking joinder of the insert 12 and carrier 14, as will be more fully described hereinafter.

Referring more specifically to the drawings, a completed carrier assembly generally indicated at 10 is shown in cross-sectional view in FIG. 7. Assembly 10 includes an insert 12 interlocked with a carrier 14. Both insert 12 and carrier 14 are made of metal or metal alloy. In the preferred form, the insert 12 is made of copper, while the carrier 14 is made of aluminum. The joinder of insert 12 and carrier 14 is carried out such that upper surfaces 20, 22 thereof form a substantially continuous upper support surface less a central raised pedestal portion 27 of the insert 12 as described more fully herein, and lower surfaces 23, 25 thereof form a substantially continuous lower surface for the assembly 10, as shown. In the preferred form, the electronic heat generating component is in the form of transistor 15 that is attached as by soldering leads 29 thereof to the circuit board 17, and the transistor flange 21 to the insert raised portion 27. In this regard, the insert raised portion 27 is sized so that with the bottom of the circuit board 17 laminated flush against the carrier assembly upper surface 20, 22, the flange 21 can be soldered to the raised portion 27 and the transistor leads 29 will be at the level of the upper surface of the circuit board 17 for soldering thereto. To this end, depending on the thicknesses of the flange 21 and circuit board 17, the portion 27 can be formed so that it is raised more or less relative to surface 20, 22 to align the leads 29 so that they sit on the top of the circuit board 17 when the flange 21 and portion 27 are engaged for soldering. Accordingly, the portion 27 may be recessed relative to surfaces 20, 22 if, for instance, the flange 27 is thicker than the circuit board 17. With the transistor 15 generally aligned with the preferred copper insert 12 and connected thereto via transistor flange 21 and insert raised portion 27, the assembly 10 will diminish the transistor thermal loads by maximizing the dissipated heat as generated during operation of the transistor 15.

In carrying out the present invention, a wide variety of metals and metal alloys can be employed for the insert 12 and carrier 14. However, as mentioned above, in the preferred form, copper and aluminum materials are chosen for cost savings as well as improved overall operation. The carrier assembly 10 is employed to provide a ground path as well as heat spreading and/or heat sinking for the circuit board 17, and specifically the power transistor 15 thereon, disposed above the assembly 10. Preferably, the circuit board 17 is placed in intimate contact with the lower surface 23, 25 of assembly 10 and is bonded thereto.

Turning now to FIGS. 1–4, the insert 12 is shown as having a rectangular or generally square shape when viewed from above. As will be seen herein, a variety of other shapes, round and multi-sided, for example, can be employed. In the preferred form, the insert 12 has an outer peripheral portion including a pair of opposite sides 26, 28 and a pair of identical ends 30. As can be seen, for example in FIG. 1, the sidewalls 26, 28 have a hook-shaped undercut recesses 36 extending between end walls 30.

Figure 3:
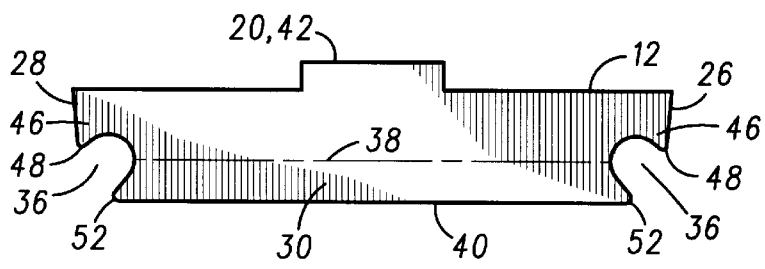
FIG. 3 is an end elevation view of the insert.

Referring to FIG. 3, insert 12 has a bottom wall 40 which preferably spans the entire distance between end walls 30. However, due to the configuration of undercut recesses 36, bottom wall 40 of insert 12 including surface 23 has a smaller width and size than that of the insert top wall 42 including surface 20. Accordingly, insert 12 is made to have a downwardly facing overhang portion 46, which, as will be seen, is used to carry out the cold forming operation on the carrier 14. In the preferred form, overhang portion 46, located adjacent top wall 42, has an outer peripheral portion of V-shaped cross-sectional shape, terminating in an edge 48. If desired, edge 48 can be made relatively sharp, however in the preferred form edge 48 is slightly rounded. In either instance, the edge 48 provides a shearing action on the preferred softer insert material during cold forming of the assembly 10, as will be described more fully hereinafter. An edge 52 where undercut recess 36 meets bottom wall 40 is also preferably rounded to promote certain advantages during cold forming interlocking joinder of the insert 12 with the carrier 14, as discussed hereinafter.

Figure 4:
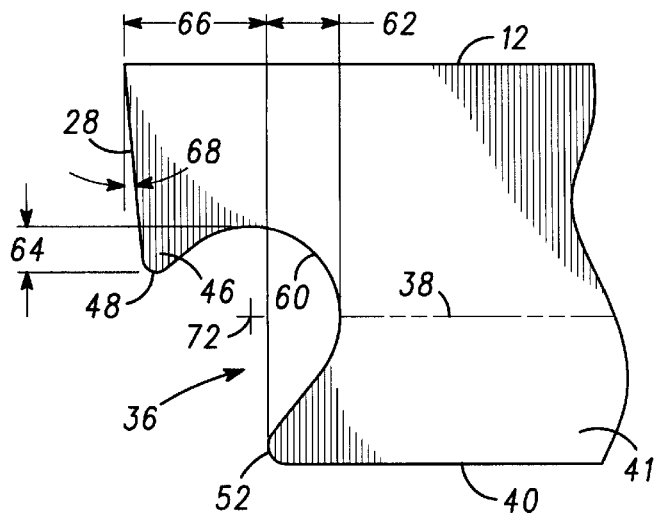
FIG. 4 is an enlarged fragmentary view of the insert of FIG. 3.

Turning now to FIG. 4, it can be seen that recess 36 is undercut in several different ways. Recess 36 is formed by a rounded, concave surface 60 formed in the side and lower portion 41 of insert 12. As can be seen, for example in FIG. 4, surface 60 extends inwardly from edge 52 and accordingly recess 36 is undercut with respect to bottom wall 40, by an amount corresponding to dimension 62 in the lateral direction between sides 26, 28. Recess 36 of the preferred form also undercuts overhang portion 46 by an amount corresponding to dimension 64 in the vertical direction between walls 40, 42. In addition, as mentioned, the insert 12 is formed with a downwardly facing overhang the dimension of which in the lateral direction is indicated by reference numeral 66. As can be seen in FIG. 4, sidewall 28 is preferably formed with a draft, being downwardly and inwardly tapered according to a draft angle indicated by reference numeral 68. As mentioned, the surface 60 forming recess 36 is curved and preferably is continuous and blended so as to aid in directing displaced material from carrier 14 during the cold formed interlocking joinder with the carrier 14. Preferably, wall 60 has a part circular configuration, as can be seen in FIG. 4, with reference to center point 72.

Figure 5:
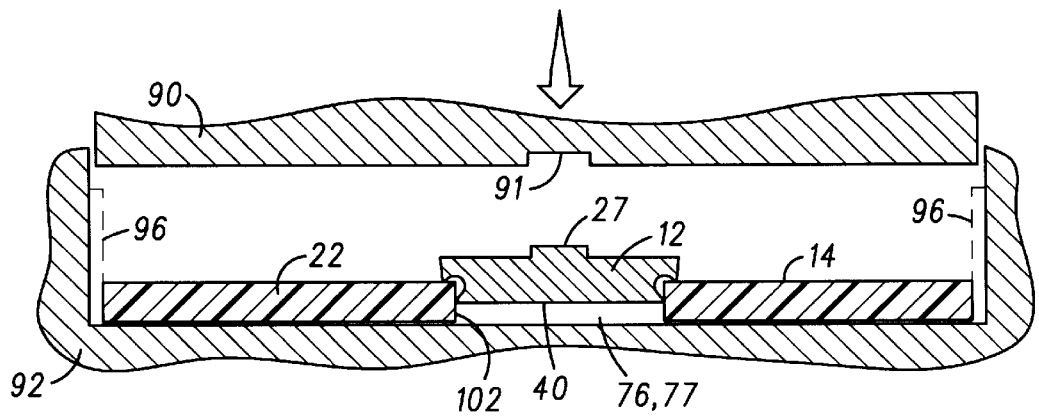
FIG. 5 is a cross-sectional view taken along the line 5—5 of FIG. 2, but with the insert and carrier plate shown prior to a pressing operation.
Figure 6:
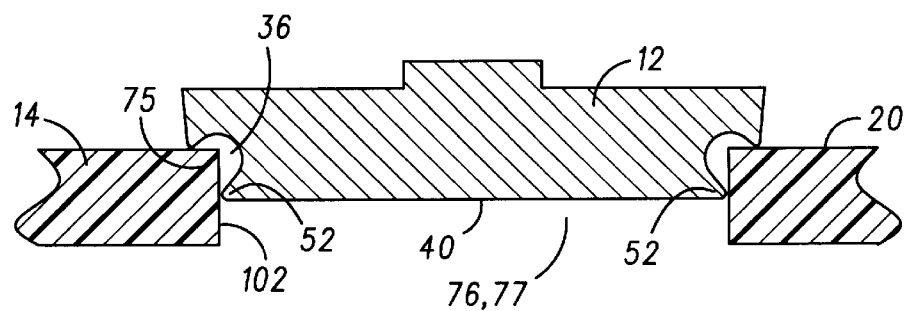
FIG. 6 is an enlarged fragmentary view of the insert and carrier plate of FIG. 5.

Turning now to FIGS. 4–6, the overhang indicated by dimension 66 in FIG. 4 provides an important manufacturing advantage. With reference to FIGS. 5 and 6, insert 12 is placed on carrier 14 preparatory to a pressing operation in which insert 12 is driven downwardly into carrier 14 displacing a portion of the carrier material, the major part of which is forced into undercut recess 36 to form an interlocking joinder. Thus, the overhang portion 46 engages upper edge portion 75 of the carrier plate 14 about opening 76 preformed therein so that the insert 12 does not fall through the opening 76 prior to the pressing operation, described more fully below.

As shown in FIG. 6, the insert bottom wall 40 is preferably dimensioned to approximately match the width of aperture 76 formed in carrier 14 for forming the carrier assembly 10. As can be seen in FIG. 5, a punch 90 can be provided that travels within a concave cylindrical stamping die 92. FIG. 5 also shows insert 12 engaging carrier 14 so as to provide a stable alignment of the insert 12 with respect to the carrier 14, in preparation for the stamping operation. The bottom portion 41 of insert 12 is preferably dimensioned for a slight clearance fit within opening or aperture 76. Alternatively, the edges 52 of the insert can be sized to tightly engage sidewall 102 of carrier 14 extending about opening 76 thereof with as by a friction fit. Preferably, the secure engagement between insert 12 and carrier 14 is established in an advanced step, preparatory to placing the insert 12 and carrier 14 in the stamping press.

As can be seen, for example, in FIG. 5, with the insert 12 and carrier plate 14 within the stamping press, a cavity 77 is formed by enclosing aperture 76 with the lower surface of die 92, carrier sidewall 102 and the wall 40 of the carrier 14.

As insert 12 is pressed into carrier 14 so as to more fully penetrate the cavity 77, carrier material is cold flowed so as to substantially fill undercut recess 36 with a minimum of voids therein. Such a complete filling is obtained by the carefully defined shape of the undercut recess surface 60 as previously described, and provides a robust joinder between the insert 12 and carrier plate 14.

As indicated in FIG. 5, punch 90 preferably has a slightly smaller width than the forming die 92. In the preferred method of manufacture, insert 12 is driven downwardly into cavity 76 using metal impacting extrusion or like stamping techniques. Die 92 forms a cylindrical die cavity within which punch 90 is allowed to travel. The punch 90 includes a central recess 91 aligned with insert pedestal portion 27 and of slightly greater size with respect thereto so that when the punch 90 is operated, the pedestal portion 27 will be captured in recess 91 to provide precise locating or centering of the insert 12 relative to the plate 14, and in particular central opening 76 thereof, as it is driven downward by the punch 90.

As shown in FIG. 5, punch 90 has a smaller cross-section than the die cavity formed by press member 92. This allows carrier material to be cold flowed around the outer surface of the punch 90, that is, flowed upwardly above the upper surface 22 of the carrier 14 as indicated by phantom line 96. For the carrier assembly 10 employed with a circuit board 17 and especially a circuit board carrying high power radio frequency circuits, upstanding walls 96 provide convenient electromagnetic shielding for the operating circuits.

The upstanding walls 96 are optional and can be omitted, if desired. When provided, upstanding walls 96 are made to be relatively thin so as to resemble sheet metal shields which heretofore were separately formed and added to the printed circuit or carrier assembly. With the present invention, shielding walls can be integrally formed with the carrier assembly 10. Further, by employing the aforedescribed metal impacting extrusion or the like stamping techniques, features can be coined into the upper surface 22 of carrier 14.

As will be appreciated from the schematic diagram shown in FIG. 5, positional control over insert 12 and its relative orientation with respect to carrier 14 is lost as the parts are loaded preparatory to a pressing operation. It is important in this regard that the relative orientation of the insert 12 and carrier 14 be assured during repeated mass production operations so as to reduce labor costs. Further, there is a risk if the insert 12 should become misaligned with the carrier 14 that the misalignment will not be "corrected", if at all, until the stamping operation is nearly completed.

As will be appreciated by those skilled in the art, further advantages are obtained with the present invention, once the insert 12 is partially inserted within the plate aperture 76. With reference to FIGS. 4 and 6, the edges 52 of insert 12 are confined by the wall 102 of carrier 14 and can ride thereagainst. This piston-like guiding action helps maintain alignment of the insert 12 as it is driven into the carrier material. As previously described, with the preferred clearance fit between the insert edges 52 and carrier wall 102, the primary aligning and centering mechanism is the central punch recess 91 which captures the insert pedestal portion 27 therein just prior to and during the pressing of the insert 12 into the plate opening 26. In addition to maintaining alignment between the insert 12 and carrier 14, preventing the insert from being "cocked" or placed out of registry with the cavity region 76, it is important that the insert be prevented from falling through the cavity 14. As can be seen with reference to FIG. 6, the overhang 46 provided in the insert 12 effectively prevents such fall-through from occurring, as previously mentioned.

It is preferred that an extra amount of carrier material be displaced, beyond that required to fill the undercut recess 36 so as to provide a robust, very tightly compressed formed joint between the insert 12 and the carrier 14 with a minimum of voids therein. Preferably, the amount of excess material does not exceed an amount ranging between 10 and 15% more than the volume of the insert recess 36 and comprises a minimum excess amount ranging between 4% and 7% of the volume of the undercut recess 36. It has been found that by providing this additional amount of cold formed material to "fill" the undercut recess, that a very tightly compressed joint is achieved. As will be appreciated, an amount of carrier material in excess of the undercut recess volume cannot, strictly speaking, be flowed into that volume, but rather, should be understood to completely fill and surround the undercut recess volume. Also, the carrier material can be more densely packed into the insert undercut 36 to provide a higher density of carrier material in the recess 36 than at other locations of the carrier 14.

Figure 8:
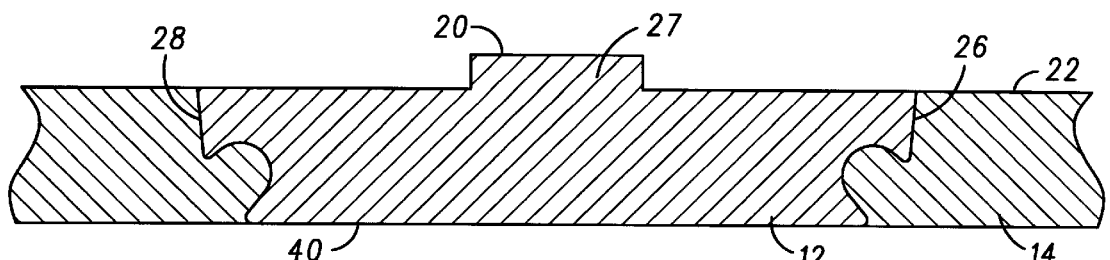
FIG. 8 is an enlarged perspective view of the insert and carrier plate of FIG. 7.

With reference to FIGS. 4–8, the edge 48 of the downwardly facing overhang portion 46 engages the upper surface 22 of carrier 14. The edge. 48 is driven into carrier 14 as downward pressure is applied to insert 12, causing the upper edge portion 75 of the carrier material adjacent the upper end of wall 102 to enter into undercut recess 36. Because the preferred material of the insert 12, i.e. copper, is harder than that of the carrier plate 14, i.e. aluminum, the edge portion 48 will act in a manner akin to a tool bit as the insert 12 is driven downward toward the plate 14 with the edge 48 shearing material from the plate 14. As the pressing operation continues, metal from carrier 14 is cold flowed about the curved wall 60 which forms undercut recess 36. The vertical undercut portion indicated by dimension 64 in FIG. 4 helps to captivate cold flow metal in a stable manner by providing a scooping action for the sheared material of the plate 14 and the continued rounded blended surface of wall 60 induces the cold flowed metal which is "skived" or sheared from carrier 14, into the lower portions of undercut recess 36 to ensure all the volume of the undercut recess 36 is filled with the carrier material for each assembly 10 formed. The horizontal undercut portion of recess 36 indicated by dimension 62, when filled with cold flowed metal from carrier 14, provides interlocking joinder, preventing subsequent withdrawal of the insert from the carrier, after stamping pressure is released. As indicated in FIGS. 7 and 8, the entire undercut recess 36 is filled with cold flowed metal. Also, cold flowed metal is forced into intimate contact with the sidewalls 26, 28 of the insert, ensuring good thermal contact between the insert 12 and the carrier 14.

As mentioned, it is generally preferred that the insert bottom edge 52 be rounded. It has been found, during refinement of the stamping procedure, that a small amount of carrier material may be forced under the bottom wall 40 of the insert, resulting in a thin foil-like wall of carrier material under insert 12. By rounding edge 52, flow characteristics of the carrier metal are made smooth and stable during the pressing operation.

As mentioned, in the preferred form, insert 12 is made of copper material and carrier 14 is made of aluminum. The use of copper for insert 12 is chosen for its thermal conductive properties so as to provide a local thermal transport enhancement for carrier 14. In the preferred form, the larger heat generating components 15 on the circuit board are located above insert 12 in order to take advantage of the increased heat sinking capability of the copper material of the insert 12. This arrangement also provides an advantage in the stamping operation since the insert material has a greater hardness than the carrier material, thereby assuring that the cold flowed joinder is accomplished in a reliable manner. In general, it is preferable that no matter which metal/metal alloy materials are chosen, that the insert material be harder than the carrier material for reasons of stamping efficiency.

Figure 9:
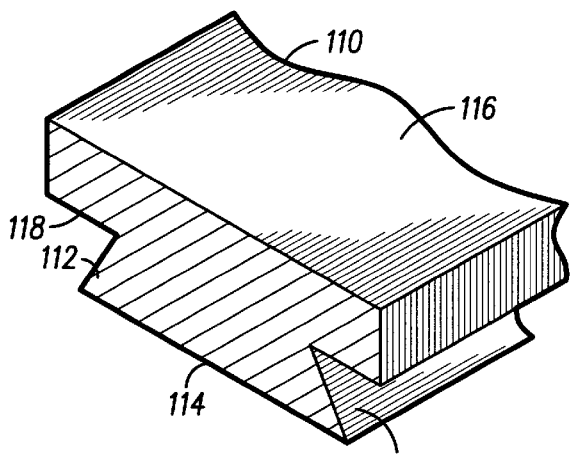
FIG. 9 is a fragmentary perspective view of an alternative form of an insert according to the principles of the present invention.
Figure 10:
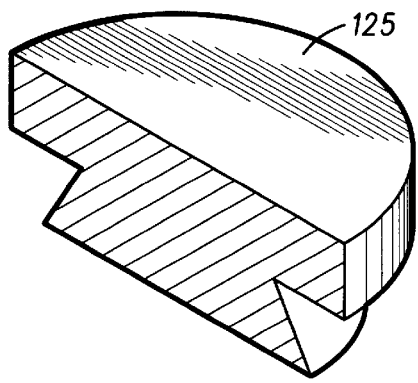
FIG. 10 is a fragmentary perspective view of another alternative form of an insert according to principles of the present invention.
Figure 11:
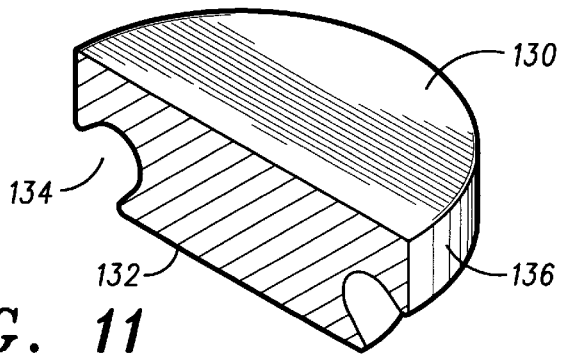
FIG. 11 is a perspective view of yet another alternative form of an insert according to principles of the present invention.

Turning now to FIGS. 9–11, various alternative forms for the insert 12 are shown. For example, in FIG. 9 an insert 110 has undercut recess 112 formed by flat wall portions so as to take on a keystone shape. overhang is provided, with the bottom wall 114 being narrower than the upper wall 116. In the form shown in FIG. 9, only a horizontal undercut is provided, with the vertical undercut corresponding to dimension 64 in FIG. 4 having been omitted. If desired, the overhang wall surfaces 118 partly forming the undercut recess 112 can be upwardly inclined so as to provide a vertical undercut.

Turning to FIG. 10, an insert 125 is provided with a cross-sectional shape similar to that of insert 110. The cross-sectional shape of insert 125 is revolved into an object of revolution, so as to give the insert 125 an outer cylindrical profile with a truncated conical bottom portion.

FIG. 11 shows an insert 130 having a cross-sectional shape similar to that of insert 12, shown for example in FIG. 3. The cross-sectional shape of insert 130 is, however, revolved into an object of revolution giving an overall cylindrical shape to the insert. The carrier adapted for use with insert 130 will have a generally cylindrical cavity region dimensioned to receive the bottom wall 132 of insert 130 in the manner described above with reference to FIG. 5 and 6. Insert 130 has a continuous, annular undercut recess 134. Insert 130 is further provided with a continuous sidewall 136 which may be cylindrical in shape, if desired, but preferably is made to have a frustoconical shape to provide a draft, similar to that described above with respect to FIG. 4.

While the present invention finds immediate application in the construction of high power radio frequency circuits, it will be readily appreciated that the present invention can be readily employed in virtually any application where a metal insert is desired to be interlockingly joined with a substrate, or plate or the like. For example, the metal insert can contain a threaded bushing or other joinder element, for example, which is readily interlockingly joined to a wall of an electronic or mechanical device, for example. Further advantages may be realized by the present invention since coining operations may be carried out by the same die used to perform the cold formed interlocking joinder.

As noted in the above, the terms "top" and "bottom" and the like have been used to describe the various surfaces and portions of the insert and carrier. These terms "top", "bottom" and similar terms are used solely for identification of certain portions of the carrier assembly and are not intended to limit the orientation of the features identified. Fairly, as will be appreciated by those skilled in the art, the carrier assembly 10 and other features of the invention can be employed in virtually any orientation desired.

The drawings and the foregoing descriptions are not intended to represent the only forms of the invention in regard to the details of its construction and manner of operation. Changes in form and in the proportion of parts, as well as the substitution of equivalents, are contemplated as circumstances may suggest or render expedient; and although specific terms have been employed, they are intended in a generic and descriptive sense only and not for the purposes of limitation, the scope of the invention being delineated by the following claims.

What is claimed is:

1. A carrier assembly comprising:
    an insert of the assembly of a first material able to dissipate heat from a circuit board; and
    a carrier plate of the assembly of a second material different from the first material with the first material having enhanced heat dissipating characteristics over the second material,
        wherein the insert is joined to the carrier plate and the joined insert and carrier plate are attached to the circuit board so that the insert is aligned with a heat generating location of the circuit board where heat dissipation is most needed, and
        wherein the carrier plate includes an opening of a predetermined size, and the insert includes an overhang portion having a predetermined configuration so that with the insert aligned with the opening the overhang portion will engage the carrier plate about the opening and the insert will not fall therethrough, and upon exerting a force on the insert in the direction of the carrier plate, the overhang portion will extrude the carrier plate material therebelow into a recess formed thereunder to form a tight joint between the insert and carrier plate.

2. The carrier assembly of claim 1 wherein the insert material is copper and the carrier plate material is aluminum.

3. A carrier assembly for a high power radio frequency circuit board and for providing heat sink therefor, the carrier assembly comprising:
    a carrier made of one or more metallic materials and having at least one internal wall defining an aperture of predetermined size;
    an insert made of one or more metal materials, and having opposed top and bottom walls and an outer peripheral portion adjacent the top wall, the top wall having a size slightly larger than that of the carrier aperture, and the bottom wall having a smaller size than the top wall; and
    said insert pressed into said carrier such that a portion of the carrier material adjacent the internal wall is flowed into the undercut recess of the insert to thereby interlock the insert and carrier together.

4. The assembly of claim 3 wherein said insert is pressed into said carrier by metal impacting extrusion.

5. The assembly of claim 3 further comprising a shielding wall that is an integral extension of said carrier and upstanding from said carrier top wall.

6. The assembly of claim 3 wherein said insert is pressed into said carrier by metal impacting extrusion carried out with a concave cylindrical die receiving said carrier, said insert, and a punch applying a pressing force to the insert, said die having a predetermined cross-sectional size and said punch having a smaller size such that a portion of said carrier is flowed away from the carrier top surface during said metal impacting extrusion to form an integral wall upstanding from said carrier.

7. The carrier assembly of claim 3 wherein said insert undercut recess has a predetermined volume, and the amount of carrier material flowed into the recess has a volume ranging between at least approximately 5 to 7% larger than the undercut recess volume to minimize voids in the undercut recess upon interlocking of the insert and carrier together.

8. The assembly of claim 7 wherein said volume of carrier material flowed is no more than approximately 10 to 15% greater than the volume of said undercut recess.

9. The assembly of claim 3 wherein said insert includes a portion that is dimensioned to fit within the carrier aperture, prior to being pressed within the carrier.

10. The assembly of claim 3 wherein said insert includes a portion that is dimensioned for a clearance fit with the internal wall of said carrier so as to substantially align said insert with respect to said carrier prior to the insert being pressed into the carrier.

11. The assembly of claim 3 wherein the outer peripheral portion of said insert has a frustoconical taper and substantially the entire outer peripheral portion is in intimate contact with carrier material when the insert is pressed into said carrier.

12. The assembly of claim 3 wherein said undercut recess is defined by a rounded concave wall.

13. The assembly of claim 3 wherein said undercut recess is formed by a plurality of generally flat walls, with said insert having a generally keystone-shaped cross-section.

14. The carrier assembly of claim 3 wherein said carrier has a preselected thickness and said insert has a thickness generally equal to that of the carrier, said carrier having a top wall and, with said insert interlocked with said carrier, a portion of the top wall of said insert adjacent said carrier top wall forms a continuous extension of the top wall of said carrier.

15. A method of making a carrier assembly for supporting a high power radio frequency circuit board and providing heat sink therefor, the method comprising:
    providing a carrier made of one or more metallic materials;
    forming an internal wall within said carrier which defines an aperture of predetermined size extending through said carrier;
    providing an insert made of one or more metallic materials, and having top and bottom walls and an outer peripheral portion adjacent the top wall;
    dimensioning the top wall to have a size larger than that of the carrier aperture;
    dimensioning the bottom wall of the insert to have a smaller size than that of the insert top wall;
    forming the insert outer peripheral portion with an undercut recess;
    aligning the insert with the carrier aperture; and
    pressing the insert into the carrier aperture so as to flow a portion of the carrier adjacent the carrier internal wall into the undercut recess of the insert to thereby interlock the insert and carrier together.

16. The method of claim 15 wherein said step of pressing said insert into said carrier is carried out by metal impact extrusion.

17. The method of claim 15 wherein the insert bottom wall is dimensioned to fit within said carrier aperture so as to align said insert and aperture prior to said pressing step.

18. The method of claim 15 wherein said bottom wall of said insert is dimensioned to engage said carrier internal wall with a clearance fit, the clearance fit aligning said insert and said carrier prior to said pressing step.

19. The method of claim 15 wherein said pressing step is carried out with a generally concave cylindrical die receiving said carrier and said insert and a punch also received within said die, the punch pressing the insert into said carrier so as to flow a portion of the carrier about the punch as a portion of the carrier is also flowed into the undercut recess of the insert, to thereby form a shielding wall upstanding from the top wall of said carrier.

20. The method of claim 19 wherein the insert has a central raised pedestal portion and the punch has a central recess, and prior to pressing the insert with the punch, aligning and centering the insert relative to the carrier aperture by capturing the pedestal portion in the punch recess before and as the punch presses the insert into the carrier aperture.

21. The method of claim 15 wherein said pressing step is carried out such that the insert top wall and said carrier form a substantially continuous surface.

22. The method of claim 15 wherein the insert undercut recess has a predetermined volume and the insert is pressed into the carrier aperture so that the amount of carrier material flowed into the undercut recess is at least between approximately 5 and 7% greater than the volume of the undercut recess.

23. The method of claim 15 wherein the insert undercut recess has a predetermined volume and the insert is pressed into the carrier aperture so that the amount of carrier material flowed into said undercut recess is no more than approximately 10 to 15% greater than the volume of said undercut recess.

24. The method of claim 15 wherein said undercut recess is formed so as to include a vertical recess extending from the undercut recess toward the top wall of said insert, and being continuously formed with said undercut recess so as to form a continuous surface for directing flowing carrier material into the undercut recess.

* * * * *